United States Patent [19]
Abraham

[11] Patent Number: 5,846,443
[45] Date of Patent: Dec. 8, 1998

[54] METHODS AND APPARATUS FOR ETCHING SEMICONDUCTOR WAFERS AND LAYERS THEREOF

[75] Inventor: Susan C. Abraham, San Jose, Calif.

[73] Assignee: Lam Research Corporation, Fremont, Calif.

[21] Appl. No.: 678,034

[22] Filed: Jul. 9, 1996

[51] Int. Cl.$^6$ .................................................. C23F 1/00
[52] U.S. Cl. ........................ 216/77; 216/75; 216/76; 216/67; 438/710; 438/715; 438/737; 438/738
[58] Field of Search ........................ 156/643.1, 646.1; 216/67, 75, 76, 77; 438/710, 715, 737, 738

[56] References Cited

U.S. PATENT DOCUMENTS

| | | | |
|---|---|---|---|
| 4,267,012 | 5/1981 | Pierce et al. | 156/643 |
| 4,740,485 | 4/1988 | Sharpe-Geisler | 437/246 |
| 4,878,994 | 11/1989 | Jucha et al. | 156/643 |
| 4,980,018 | 12/1990 | Mu et al. | 156/643 |
| 5,246,888 | 9/1993 | Miyamoto | 437/245 |
| 5,256,245 | 10/1993 | Keller et al. | 156/643 |
| 5,320,707 | 6/1994 | Kanekiyo et al. | 156/665 |
| 5,326,427 | 7/1994 | Jerbic | 156/643 |
| 5,356,478 | 10/1994 | Chen et al. | 134/1 |
| 5,411,631 | 5/1995 | Hori et al. | 216/72 |
| 5,429,070 | 7/1995 | Campbell et al. | 118/723 |
| 5,496,762 | 3/1996 | Sandhu et al. | 437/60 |
| 5,522,520 | 6/1996 | Kawamoto | 216/62 |
| 5,540,812 | 7/1996 | Kadomura | 156/652.1 |
| 5,545,289 | 8/1996 | Chen et al. | 156/643.1 |
| 5,562,801 | 10/1996 | Nulty | 156/643.1 |
| 5,609,775 | 3/1997 | Liu | 216/77 |
| 5,620,615 | 4/1997 | Keller | 438/720 |

FOREIGN PATENT DOCUMENTS

| | | |
|---|---|---|
| 489 407 A2 | 6/1992 | European Pat. Off. |
| 622 477 A1 | 11/1994 | European Pat. Off. |
| 3842758 | 6/1990 | Germany |

OTHER PUBLICATIONS

Riley, P; Holbert, R; Kavari, R; and Lujan, L., "Composite metal etching for submicron integrated circuits" Extented Abstracts, vol. 93, No. 1, May 1993, Princeton, NJ.

Riley, P; Peng, S; and Fang, L., "Plasma Etching of Aluminum for ULSI Circuits", Solid State Technology, vol. 36, No. 2, Feb. 1993, Washington.

Gottscho, R.S; Jurgensen, C.W; Vitkavage, D.J., "Microscopic Uniformity in Plasma Etching", Journal of Vacuum Science and Technology B, Microelectronic Process and Phenomomena, vol. 10, No. 5, Oct. 1992, pp. 2133–2147.

T.H. Ahn, S.W. Nam, K.J. Min, and C. Chung, "Effect of Residual Gases on Redidue Formation During Tungsten/TiN/Ti Etching Using $SF_6$ and $Cl_2$ Gas Chemistry," Jpn. J. Appl. Phys. vol. 33 (1994) pp. L918–L920, Part 2, No. 7A, Jul. 1, 1994.

Patent Abstract of Japan, vol. 95, NO. 6, Jul. 31, 1995.

PCT Search Report dated Sep. 26, 1997 corresponding to PCT case PCT/US97/11336.

*Primary Examiner*—M. Nuzzolillo
*Assistant Examiner*—Steven H. VerSteeg
*Attorney, Agent, or Firm*—Beyer & Weaver, LLP

[57] ABSTRACT

A method in a plasma processing chamber, for etching through a selected portion of an aluminum-containing layer and a titanium-containing layer. The titanium-containing layer is disposed above the aluminum-containing layer. The method includes a first etching step that etches at least partially through the titanium-containing layer using a first source gas composition. The first source gas composition consists essentially of the $Cl_2$ etchant and a first mixture. The first mixture consists essentially of HCl and $CHF_3$. The first source gas composition has a first flow ratio of the $Cl_2$ etchant to the first mixture. There is further included a second etching step that etches at least partially through the aluminum-containing layer using a second source gas composition. The second source gas composition consists essentially of a $Cl_2$ etchant and a second mixture. The second mixture consists essentially of HCl and $CHF_3$. The second source gas composition has a second flow ratio of the $Cl_2$ etchant to the second mixture different from the first flow ratio.

26 Claims, 5 Drawing Sheets

METHODS AND APPARATUS FOR ETCHING SEMICONDUCTOR WAFERS AND LAYERS THEREOF

BACKGROUND OF THE INVENTION

The present invention relates to the fabrication of semiconductor integrated circuits (IC's). More particularly, the present invention relates to methods and apparatus for etching through an IC's layer stack, including the aluminum-containing layer, the TiN-containing layer, and/or the TiW-containing layer, during IC fabrication.

In semiconductor IC fabrication, devices such as component transistors may be formed on a semiconductor wafer or substrate, which is typically made of silicon. Metallic interconnect lines, which are typically etched from a metallization layer disposed above the wafer, may then be employed to couple the devices together to form the desired circuit. To facilitate discussion, FIG. 1 illustrates a cross-section view of a layer stack 20, representing some of the layers formed during the fabrication of a typical semiconductor IC. It should be noted that other additional layers above, below, or between the layers shown may be present. Further, not all of the shown layers need necessarily be present and some or all may be substituted by other different layers.

At the bottom of layer stack 20, there is shown a wafer 100. An oxide layer 102, typically comprising $SiO_2$, may be formed above wafer 100. A barrier layer 104, typically formed of a titanium-containing layer such as Ti TiW, TiN or other suitable barrier materials, may be disposed between oxide layer 102 and a subsequently deposited metallization layer 106. Barrier layer 104, when provided, functions to prevent the diffusion of silicon atoms from oxide layer 102 into the metallization layer.

Metallization layer 106 typically comprises copper, aluminum or one of the known aluminum alloys such as Al—Cu, Al—Si or Al—Cu—Si. When a layer contains aluminum or one of its alloys, that layer is referred to herein as the aluminum-containing layer. The remaining two layers of FIG. 1, i.e., an anti-reflective coating (ARC) layer 108 and an overlying photoresist (PR) layer 110, may then be formed atop metallization layer 106. The ARC layer 108, typically comprising another titanium-containing layer such as TiN or TiW, may help prevent light (e.g., from the lithography step that patterns the photoresist) from being reflected and scattered off the surface of the metallization layer 106 and may, in some cases, inhibit hillock growth. Note that when a layer contains titanium, such as TiN or TiW, that layer is referred to herein as the titanium-containing layer.

Photoresist layer 110 represents a layer of conventional photoresist material, which may be patterned for etching, e.g., through exposure to ultra-violet rays. The layers of layer stack 20 are readily recognizable to those skilled in the art and may be formed using any of a number of suitable and known deposition processes, including chemical vapor deposition (CVD), plasma-enhanced chemical vapor deposition (PECVD), and physical vapor deposition (PVD) such as sputtering.

To form the aforementioned metallic interconnect lines, a portion of the layers of the layer stack, including the metallization layer, e.g., metallization layer 106, may be etched using a suitable photoresist technique. By way of example, one such photoresist technique involves the patterning of photoresist layer 110 by exposing the photoresist material in a contact or stepper lithography system, and the development of the photoresist material to form a mask to facilitate subsequent etching. Using an appropriate etchant, the areas of the metallization layer that are unprotected by the mask may then be etched away using an appropriate etching source gas, leaving behind metallization interconnect lines or features.

For illustration purposes, FIG. 2 shows a cross-section view of layer stack 20 of FIG. 1 after conventional etching using, for example, a prior art $Cl_2/BCl_3$ etchant source gas, is completed. In this example, the metallic interconnect lines are represented by the unetched portions of metallization layer 106.

To achieve greater circuit density, modem IC circuits are scaled with increasingly narrower design rules. As a result, the feature sizes, i.e., the width of the interconnect lines or the spacings (e.g., trenches) between adjacent interconnect lines, have steadily decreased. By way of example, while a line width of approximately 0.8 microns ($\mu$m) is considered acceptable in a 4 megabit (Mb) dynamic random access memory (DRAM) IC, 256 Mb DRAM IC's preferably employ interconnect lines as thin as 0.25 microns or even thinner.

As the feature sizes shrink, it becomes increasingly difficult to achieve a uniform etch rate across the wafer. Typically, the etch rate in the narrow spacings is slower than that in the wider, open field regions. This phenomenon, referred herein as the loading in etch rates, maybe a consequence of microloading and aspect ratio dependent etching (ARDE). Microloading refers primarily to the situation wherein the etch rate is smaller in areas where there is a high density of line spacings relative to the etch rate of identically sized trenches located in a less dense area. ARDE, on the other hand, refers primarily to the situation wherein variations in etch rates among trenches that are located in areas of similar trench density and among trenches that have different aspect ratios. The loading in etch rates causes trenches to be formed in the layer stack at different rates. The loading in etch rates becomes more severe when trench widths fall below about 0.5 microns, and especially when trench widths fall below about 0.35 microns. As a result of the etch rate variations, by the time metal etching is complete in areas having a slow etch rate (e.g., in the narrower line spacings), overetching, i.e., the undue and inadvertent removal of materials from underlying layers, may already occur in areas having a higher etch rate (e.g., the open field regions).

With reference to FIG. 2, area 120 represents the open field region where the metallization layer is overetched (by distance d1), and area 122 represents the underetched area, where the metallization is underetched (by distance d2). If the etch rate variations are sufficiently large, it may not be possible, for some geometry, to etch though the target layer, e.g., the metal layer, in the narrower spacings before undue damage to the underlying layers in the open field regions occurs. For example, large etch rate variations may cause undue overetching and excessive oxide loss in area 120, rendering the wafer undergoing processing unsuitable for use in IC fabrication.

Further, the prior art etchant source gas, e.g., $Cl_2/BCl_3$, generally results in relatively low selectivity to photoresist. Selectivity refers generally to the ability of an etchant source gas to discriminate between different layers of the wafer stack that may be exposed to the plasma during an etch. For a given etch, an etchant source gas having a low photoresist selectivity tends to etch away at the protective photoresist features at a higher rate than an etchant source gas having a high photoresist selectivity.

The photoresist selectivity issue becomes more important as the etch geometry becomes smaller since the thickness of the protective photoresist layer tends to be thinner with reduced etch geometry. If too much of the protective photoresist is etched away during an etch, e.g., due to the use of an etchant source gas that has a low selectivity to photoresist, portions of the wafer may become damaged since features that are supposed to be protected from etching by the protective photoresist features are instead exposed to the etch through the worn photoresist mask regions. In some cases, control of the features' critical dimension (CD) may be difficult due to the inability of the photoresist to provide adequate protection when a low selectivity-to-photoresist etch process is employed.

In view of the foregoing, what is desired are improved methods and apparatus for etching through a wafer's layer stack, including the aluminum-containing metallization layer, the TiN-containing layer, and/or the TiW-containing layer.

SUMMARY OF THE INVENTION

The invention relates, in one embodiment, to a method in a plasma processing chamber, for etching through an aluminum-containing layer and TiN layer. The TiN layer is disposed above the aluminum-containing layer. The method includes a first etching step that etches at least partially through the TiN layer using a first source gas composition. The first source gas composition comprises a $Cl_2$ etchant and a first mixture. The first mixture comprises HCl and $CHF_3$.

The invention relates, in another embodiment, to a method in a plasma processing chamber, for etching through a selected portion of an aluminum-containing layer and a titanium-containing layer. The titanium-containing layer is disposed above the aluminum-containing layer. The method includes a first etching step that etches at least partially through the titanium-containing layer using a first source gas composition. The first source gas composition consists essentially of the $Cl_2$ etchant and a first mixture. The first mixture consists essentially of HCl and $CHF_3$. The first source gas composition has a first flow ratio of the $Cl_2$ etchant to the first mixture.

The method further includes a second etching step that etches at least partially through the aluminum-containing layer using a second source gas composition. The second source gas composition consists essentially of a $Cl_2$ etchant and a second mixture. The second mixture consists essentially of HCl and $CHF_3$. The second source gas composition has a second flow ratio of the $Cl_2$ etchant to the second mixture different from the first flow ratio.

In yet another embodiment, the invention further includes a second etching step that etches at least partially through the aluminum-containing layer using a second source gas composition. The second source gas composition comprises the $Cl_2$ etchant and a second mixture. The second mixture comprises HCl and $CHF_3$. The second source gas composition has a second flow ratio of the $Cl_2$ etchant to the first mixture different from the first flow ratio.

These and other advantages of the present invention will become apparent upon reading the following detailed descriptions and studying the various figures of the drawings.

DETAILED DESCRIPTION OF THE PREFERRED EMBODIMENTS

Figure 1:
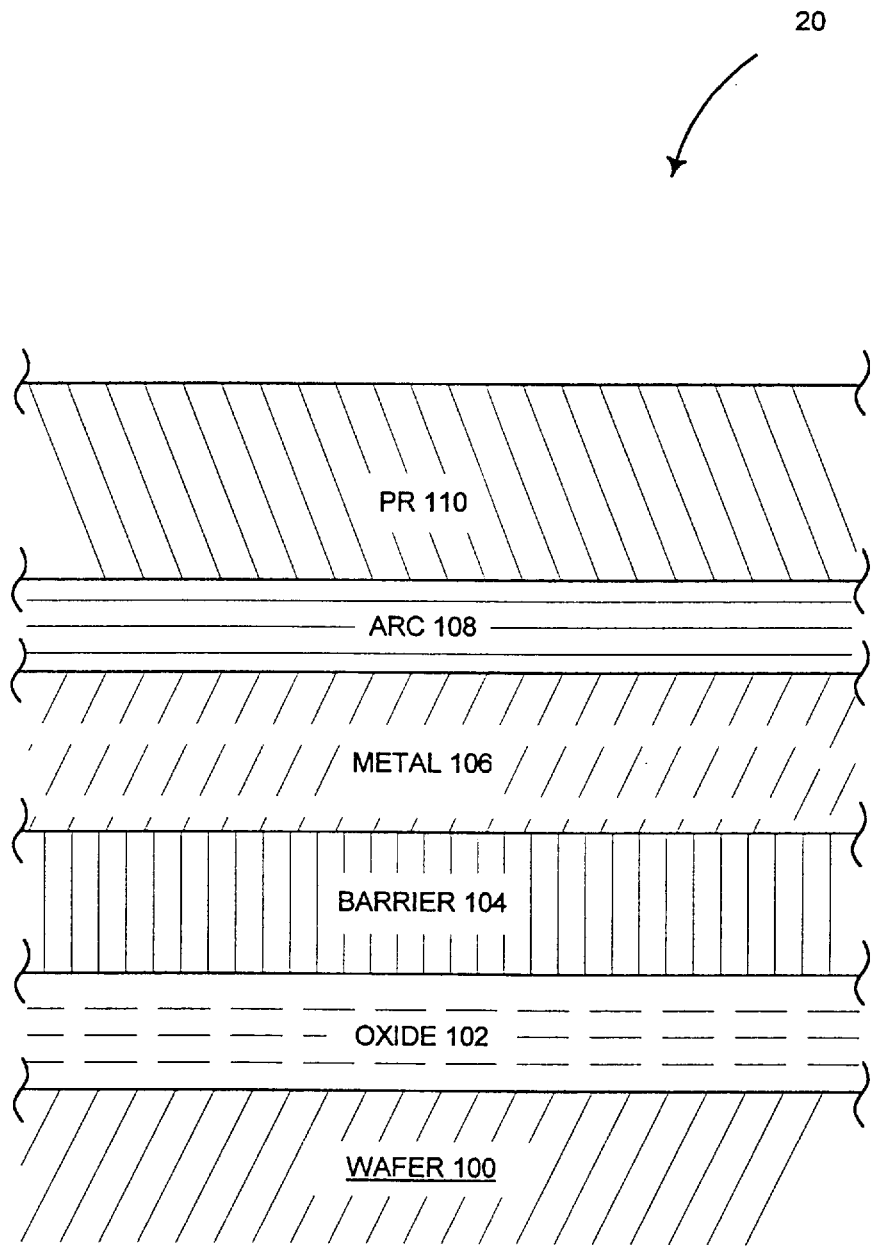
FIG. 1 illustrates a cross-section view of a layer stack, representing the layers formed during the fabrication of a typical semiconductor IC.
Figure 2:
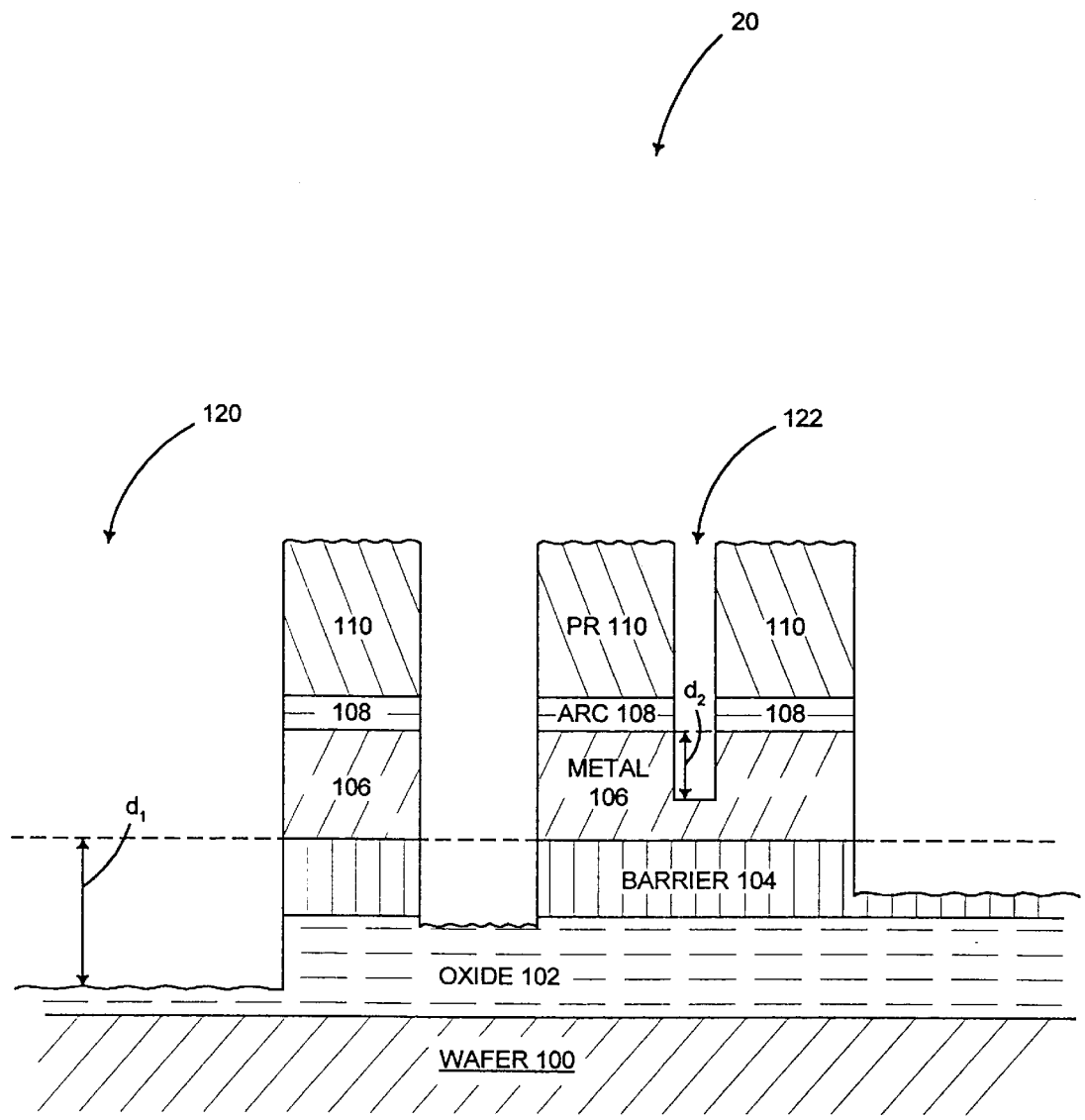
FIG. 2 illustrates a cross-section view of the layer stack of FIG. 1 after conventional etching using prior art $Cl_2/BCl_3$ etchant source gas is completed.

An invention is described for, among others, improved etching through the layers of a wafer stack, including the aluminum-containing layer, the TiN-containing layer, and/or the TiW-containing layer. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

In accordance with one aspect of the present invention, the aforementioned etch rate loading and low selectivity to photoresist problems are alleviated by etching the layer stack with an inventive source gas. In one embodiment, the inventive source gas comprises $Cl_2$ and a mixture comprising a HCl or HBr halogen and a freon such as $CHF_3$ or $C_2HF_5$. In one specific embodiment, the inventive source gas comprises $Cl_2HCl$/and a freon such as $CHF_3$.

The etch is performed, in one embodiment, in two steps with two different compositions of the inventive source gas. This first source gas composition etching step preferably proceeds at least partially through the titanium-containing layer, such as ARC layer 108 of FIG. 1 for example, using the inventive source gas with a first flow ratio of the component gases. In one preferred embodiment, the inventive source gas employed is $Cl_2/HCl/CHF_3$.

Thereafter, the layer stack is etched again, albeit with a second source gas composition of the inventive source gas that may be different in the ratio of the component gases from the first source gas composition. This second source gas composition etching step is then preferably allowed to proceed at least partially through the aluminum-containing layer, e.g., the aluminum-containing metallization layer 106 of FIG. 1. In one preferred embodiment, the inventive source gas employed is $Cl_2/HCl/CHF_3$.

Further, if there is another TiN layer, it may be etched again using an inventive source gas composition that has a suitable ratio of the component gases for etching TiN. In one case, the layer stack may have a very thin layer of TiN barrier layer underlying the aluminum-containing layer. In this case, it is possible, due to the thinness of this TiN barrier layer, to use the same inventive source gas composition employed for the bulk aluminum etch, to etch through the thin TiN barrier layer. This has the advantage of simplifying the overall etching process with little, if any, impact on the wafer throughput since the barrier layer is relatively thin and may be quickly etched even with an inventive source gas composition that does not have the optimum component gas flow ratio for etching TiN.

Additionally, the fluorine species (due to the freon component gas, e.g., $CHF_3$ or $C_2HF_5$) also renders the inventive source gas suitable for etching a TiW-containing layer. Accordingly, the TiW-containing layer may also be etched, using an inventive source gas composition, in one embodiment.

Note that it is not required to etch, in a layer stack, each of the aluminum-containing layer, the TiN layer, and/or the TiW layer with the inventive source gas. It is possible to employ the inventive source gas to etch, partially or wholly, through only one or some of these layers and the other layers may be etched using other conventional chemistries. For example, the inventive source gas may be employed to etch only the TiN layer to achieve a faster etch rate and the bulk etch may be etched by a conventional chemistry. Conversely, the bulk etch may be performed using the inventive source gas to improve selectivity to photoresist while other layers of the layer stack may be etched using other conventional chemistries.

The inventive etch process may be performed in any of the known plasma processing apparatuses, including those adapted for dry etching, plasma etching, reactive ion etching (RIE), magnetically enhanced reactive ion etching (MERIE), or the like. To further elaborate, in a typical plasma processing chamber adapted for dry etching, the wafer is treated with plasma. The chamber includes an inlet port through which process etchant source gases are supplied to the chamber interior. A suitable RF energy source, e.g., an RF energy source, is applied to electrodes associated with the chamber to induce plasma. The energy itself may be coupled inductively or capacitively to sustain the plasma, as is known. Species are then formed from the etchant source gas to react with the wafer and etch away at the plasma-contacting layer of the wafer layer stack. The by-products, which may be volatile, are then exhausted through an exit port.

Plasma etching relates to the situation where the wafer is positioned on the anode, or ground electrode during wafer processing. On the other hand, reactive ion etching (RIE) relates to the situation where the wafer is positioned on the cathode, or powered electrode during processing. Magnetically enhanced reactive ion etching (MERIE) represents a variant of the RIE reactor geometry wherein a magnetic field is applied to reduce the loss of energetic electrons to the reactor wall surfaces. It has been found the MERIE reactors, under certain conditions, can increase the efficiency of the energy transfer from the electrodes to the electrons in the plasma.

It is contemplated that the invention may be practiced in any of the above reactors, as well as other suitable plasma processing reactors. Note that the above is true irrespective whether energy to the plasma is delivered through capacitively coupled parallel electrode plates, through electron cyclotron resonance (ECR) microwave plasma sources, through inductively coupled RF sources such as helicon, helical resonators, and transformer coupled plasma (TCP). ECR and TCP plasma processing systems, among others, are available from Lam Research Corporation of Fremont, Calif.

Figure 3:
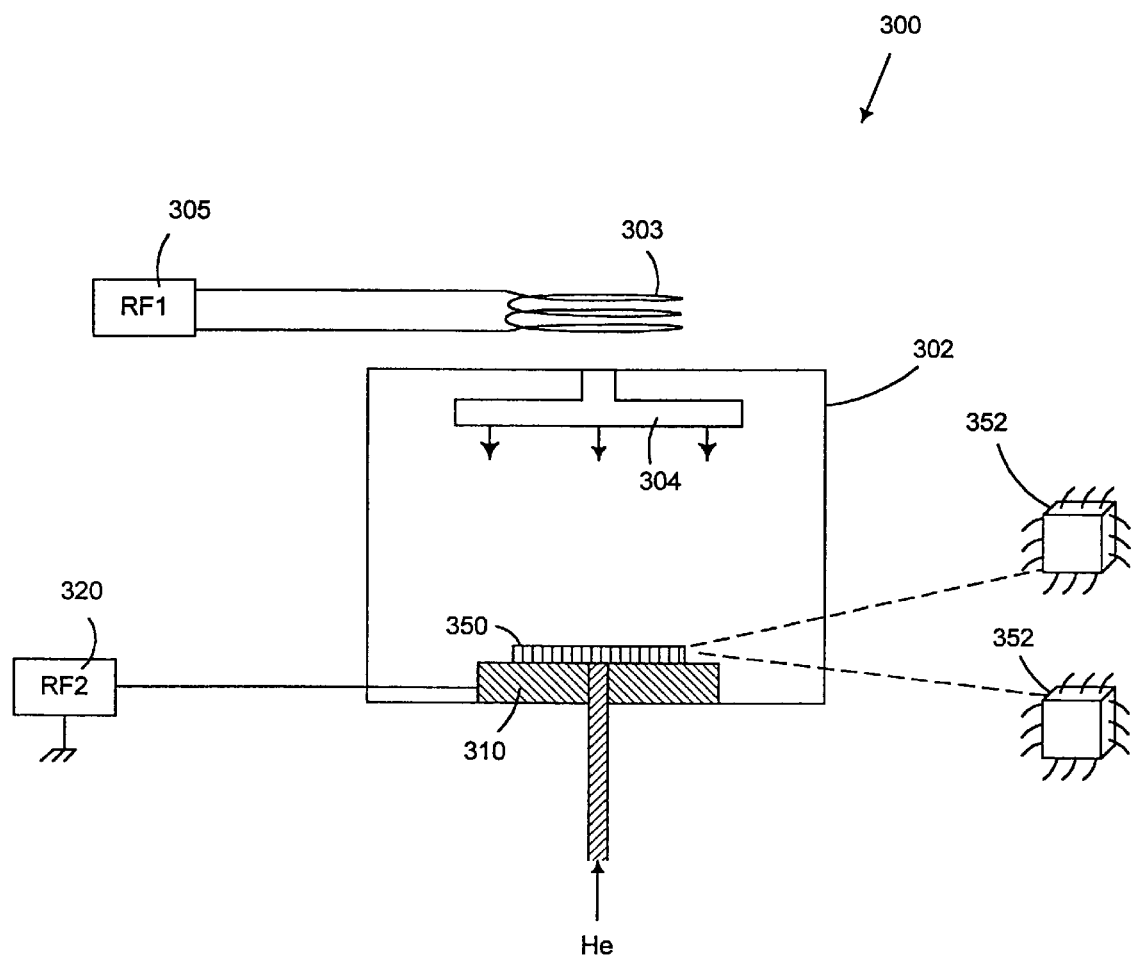
FIG. 3 illustrates a simplified schematic of the TCP™ 9600 SE plasma reactor, representing a suitable plasma processing system for use with the inventive etch process.

In a preferred embodiment, the present invention is employed in a TCP™ 9600 SE plasma reactor, which is available from Lam Research Corporation, although, as mentioned above, any other conventional and suitable plasma processing systems may well be employed. FIG. 3 illustrates a simplified schematic of the TCP™ 9600 SE plasma reactor, including wafer 350 and integrated circuit chips 352, which are fabricated from dies cut from wafer 350 after the wafer is etched according to the inventive etch technique and processed in conventional post-etch steps. Referring to FIG. 3, a wafer reactor 300 includes a plasma processing chamber 302. Above chamber 302, there is disposed an electrode 303, which is implemented by a coil in the example of FIG. 1. Coil 303 is energized by a RF generator 305 via a matching network (not shown in FIG. 3).

Within chamber 302, there is provided a shower head 304, which preferably includes a plurality of holes for releasing gaseous source materials, e.g., the etchant source gases, into the RF-induced plasma region between itself and a wafer 350. The gaseous source materials may also be released from ports built into the walls of the chamber itself. Wafer 350 is introduced into chamber 302 and disposed on a chuck 310, which acts as a second electrode and is preferably biased by a radio frequency generator 320 (also typically via a matching network). Helium cooling gas is introduced under pressure (e.g., about 5–10 Torr in one embodiment) between chuck 310 and wafer 350 to act as a heat transfer medium for accurately controlling the wafer's temperature during processing to ensure uniform and repeatable etching results. During plasma etching, the pressure within chamber 302 is preferably kept low, e.g., between about 2–60 mTorr in one embodiment. A plurality of heaters (omitted from FIG. 1 to simplify the illustration) may be provided to maintain a suitable chamber temperature for etching (e.g., about 40°–70° C. in one embodiment). To provide a path to ground, the chamber wall of chamber 302 is typically grounded.

In accordance with one embodiment of the present invention, the titanium containing layer of the wafer stack is etched with an inventive first source gas composition. By way of example, the TiN ARC layer may represent the target layer for this first inventive source gas composition etch. Although it is contemplated in this embodiment that the anti-reflective coating layer represent the layer which undergoes etching with the first source gas composition, this first source gas composition etching step may also be performed, in certain wafer stack structures, on any other layer.

In accordance with one embodiment, etching with the first source gas composition preferably terminates when it is determined that the titanium-containing layer is etched through. If the first source gas composition etch is performed on a TiN layer, endpoint detection may be accomplished by optically monitoring the rise of the 703 nm wavelength in the plasma, which indicates that substantially the entire thickness of the TiN layer has been etched through. Etching may then terminate immediately. Other conventional methods to determine the termination point for this first source gas composition etch step may also be employed.

In accordance with one aspect of the present invention, the first source gas composition for a TiN layer etch comprises three different component gases: $Cl_2$, HCl, and $CHF_3$. It is believed that the $Cl_2$ act as the main etchant while the HCl and $CHF_3$ perform the selectivity improvement function. The ratio of the main etchant component gas to the inhibitor component gas(es), e.g., the ratio of $Cl_2$ to $CHF_3$ and/or of $Cl_2$ to HCl, are preferably optimized for the TiN layer etch in this first source gas composition etching step. It is contemplated that some additives, e.g., $N_2$, may be added if desired.

The use of the inventive $Cl_2/HCl/CHF_3$ gas as the source gas for etching through the TiN layer advantageously results in improved wafer throughput. This is because inventive $Cl_2/HCl/CHF_3$ source gas, in one embodiment, etches through TiN at a higher rate than does prior art $Cl_2/BCl_3$ chemistry. For example, while the prior art $Cl_2/BCl_3$ chemistry has a TiN etch rate of about 2,500–3,000 angstroms/minute, the inventive $Cl_2/HCl/CHF_3$ source gas may etch the TiN layer at about 10,000 angstroms/minute in one embodiment. When the TiN layer etch rate improves, the wafer throughput increases.

In accordance with one aspect of the present invention, the etch rate loading on a wafer stack may be reduced by using the inventive source gas in the beginning of the etch (e.g., on the layer overlying the metallization layer such as the TiN ARC layer) to resolve, to some extent, the etch rate loading issue at this beginning stage. For example, the inventive source gas may be employed to etch only the TiN layer to address the etch rate loading issue and any conventional chemistry, e.g., $Cl_2/BCl_3$, may be employed for the bulk etch.

Subsequently, the remainder of the layer stack may be etched down at least partially through the aluminum-containing layer, e.g., the aforementioned metal layer 106 of FIG. 1, with a second source gas composition of the inventive source gas. In one embodiment, the second source gas composition may be employed to etch through both the metallization layer and a metallization-underlying layer, such as a TiN barrier that may be disposed under the aluminum-containing metallization layer. The second source gas composition is preferably different from the first source gas composition in its ratio of main etchant component gas to inhibitor component gas(es). For example, the ratio of the main etchant component gas $Cl_2$ to $CHF_3$ and/or of $Cl_2$ to HCl in the second source gas composition may be, in one embodiment, different from analogous ratios in the first source gas composition.

In one embodiment, etching with the second source gas composition may terminate when the aluminum-containing layer is at least partially etched through. In this case, another chemistry may be employed to etch through the remaining of the aluminum-containing layer. More preferably, etching with the second source gas composition terminates when it is determined that the aluminum-containing layer is substantially etched through. In one embodiment, endpoint detection is accomplished by optically monitoring the rise of the 261 nm optical wavelength in the plasma, which indicates that substantially the entire thickness of the aluminum-containing layer has been etched through. The second source gas composition etch may then terminate immediately or may be allowed to continue for a predetermined period of time, e.g., a few additional seconds, to ensure the complete removal of the aluminum-containing layer material. To simplify the etching process, the second source gas composition etch may be further extended to etch through the aforementioned a metallization-underlying layer, such as a TiN barrier that may be disposed under the aluminum-containing metallization layer.

The use of the inventive first source gas composition that includes $Cl_2$ and HCl (or HBr) and a freon (such as $CHF_3$ or $C_2HF_5$) to etch through the titanium-containing barrier layer yields several important advantages. By way of example, in addition to the aforementioned fast TiN etch rate (which improves throughput),the high TiN-to-oxide selectivity of the inventive source gas (e.g., up to about 5.5:1 in one case for a $Cl_2/HCl/CHF_3$ source gas) advantageously results in less damage to the underlying oxide layer. In contrast, the prior art $Cl_2/BCl_3$ suffers disadvantages associated with a slower TiN etch rate (typically about 2,500 angstroms/minute, which hampers wafer throughput) and a lower selectivity to oxide (typically about 2:1 or even lower for prior art $Cl_2/BCl_3$ chemistry). The higher TiN-to-oxide selectivity is especially advantageous in preventing excessive oxide loss in the wide spaces when the barrier etch step is extended to ensure that all barrier layer material, even in the narrow spaces, is removed.

In the prior art $Cl_2/BCl_3$ etch, which is typically employed for etching through both the TiN ARC layer and the metallization layer, the etch rate loading for a 6-inch wafer having a 0.35 micron geometry is found to be about 25%–30% at the wafer's edge, i.e., the etch rate in the open field regions is about 25%–30% faster than that in the 0.35 micron spacings at the wafer's edge. In contrast, the etch rate loading achieved for an etch process that employs the inventive $Cl_2/HCl/CHF_3$ source gas is found to be about 4% at the wafer's edge. In one embodiment, the etch rate loading values for the prior art $Cl_2/BCl_3$ etchant source gas and the inventive $Cl_2/HCl/CHF_3$ source gas are, at the wafer's center, about 18% and 4% respectively for an 6-inch wafer (0.35 micron geometry).

Due to the reduced etch rate loading, the etching time advantageously does not have to be extended to allow the metal layer to be etched through in the narrow spacings. The shorter etching time, in addition to improving wafer throughput, further reducing damage to the protective photoresist mask regions during bulk etching, thereby improving the ability of the photoresist mask regions to protect the underlying features during etching.

It is speculated that the following mechanisms may be responsible for producing the advantageous etch results discussed herein. The fluorine species in the freon, e.g., $CHF_3$ and/or $C_2HF_5$, act to increase the etch rate for TiN, thereby advantageously improving the wafer throughput. In addition to the chemical that is mainly responsible for etching (e.g., $Cl_2$), the inventive source gas further includes chemicals believed to be polymer-forming (e.g., $C_2HF_5$/$CHF_3$ and/or HCl/HBr). It is believed that because of the presence of the polymer forming chemicals, the inventive source gas etches away the target layer (e.g., the TiN layer and/or the aluminum-containing layer and/or the TiW-containing layer) while simultaneously deposits polymer thereon.

It is further believed that the use of a polymer-forming chemical in the inventive source gas micromasks the wider spacings, i.e., causing masking polymers to be deposited in the wider spacings at a faster rate than in the narrower spacings, particularly during the etch of the aluminum-containing layer. Due to the micromasking phenomenon, the etch rate in the wider spacings may be slowed, thereby reducing the difference between the etch rate in the wider spacings and that in the narrower spacings.

The etch rate may be adjusted by appropriately modifying the flow volume ratio of the polymer-forming agent. Byway of example, increasing the ratio of the flow volume of the polymer-forming chemical (e.g., $CHF_3$ and/or HCl) tends to reduce the etch rate due to the increase in polymer deposition during etching.

Another possible explanation involves the possibility of the $CHF_3$ component gas to change the surface diffusion of the $Cl^+$ reactive species to allow these species to migrate downward toward the bottom of the trench more readily instead of clinging to the aluminum side wall. It is believed that the $HCl/CHF_3$ may modify the nature of the polymer on sidewalls to possibly reduce its affinity for some ions, e.g., $Cl^+$, thereby allowing more of these ions to diffuse toward the bottom of the trench to improve etching therein.

It is also believed that HCl (or HBr) may, in some cases, serve as a source for hydrogen for the etching reaction, thereby supplementing any hydrogen from the photoresist. The increased availability of hydrogen may improve the selectivity to photoresist. Further, HCl may have a role in changing the angle of distribution of ions. In some cases, this may reduce ion scattering, which may improve ion directionality and/or the etch rate.

In the present invention, it is believed that the freon, e.g., $CHF_3$, furnishes the sidewall passivation to a greater extent than the $BCl_3$ of the prior art $Cl_2/BCl_3$ aluminum etch. Consequently, it is possible to increase the $Cl_2$ flow during the aluminum etch without creating undue undercutting of the aluminum features. In fact, the $Cl_2$ flow rate is increased for the aluminum etch in one embodiment to achieve this very effect, i.e., a higher aluminum etch rate.

By way of example, Table 1 below shows, in accordance with one embodiment, the approximate process parameters that may be suitable for etching a TiN layer using a composition of the inventive $Cl_2/HCl/CHF_3$ source gas. In the experiment associated with Table 1, the TiN etch is performed in a TCP™ 9600 SE plasma reactor on a layer of 1,000-angstrom thick TiN material disposed on a 6" wafer. The etches are performed at a chamber temperature of about 70° C. In Table 1, an approximate preferred range, an approximate more preferred range, and an approximate preferred value of the $Cl_2$ flow rate in standard cubic centimeters per minute (herein "sccm"), the HCl flow rate (in sccm and in the ratio of $Cl_2$:HCl flows), the $CHF_3$ flow rate (in sccm and in the ratio of $Cl_2$:$CHF_3$ flows), top electrode power (in watts), bottom electrode power (in watts), chamber pressures (in milliTorr), and lower electrode temperature (in ° C.) are shown. Other parameter values that may be helpful for the TiN etch will be readily apparent to those skilled in the art, whether for the same wafer and anti-reflection layer or other wafers and anti-reflection layers. Further, approximate scaling of the parameters may be performed, as can be appreciated by those skilled in the art, to accommodate other wafer sizes and/or chamber volumes.

TABLE 1

|  | Preferred Range | More Preferred Range | Preferred Value |
|---|---|---|---|
| $Cl_2$ flow rate (sccm) | 40–90 | 40–60 | 50 |
| HCl flow rate (sccm) | 10–40 | 10–25 | 17 |
| (Approx. Ratio of $Cl_2$:HCl Flow) | 9:1–1:1 | 6:1–1.5:1 | 3:1 |
| $CHF_3$ flow rate (sccm) | 5–20 | 5–15 | 7 |
| (Approx. Ratio of $Cl_2$:$CHF_3$ Flow) | 14:1–2:1 | 12:1–2.5:1 | 7:1 |
| Top Power (Watts) | 400–600 | 400–560 | 560 |
| Bottom Power (Watts) | 120–280 | 120–200 | 140 |
| Pressure (milliTorr) | 2–80 | 2–20 | 15 |
| Temperature (°C.) | 30–80 | 40–70 | 50 |

Table 2 below shows, in accordance with one embodiment, the approximate process parameters that may be suitable for etching an aluminum-containing layer using a composition of the inventive $Cl_2/HCl/CHF_3$ source gas. In one embodiment, the parameters shown in Table 2 are also employed for etching the TiN barrier layer that underlies the aluminum-containing layer. In the experiment associated with Table 1, the aluminum etch is performed in a TCP™ 9600 SE plasma reactor on a 6,000-angstrom thick aluminum alloy layer disposed on a 6" wafer. In Table 2, an approximate preferred range, an approximate more preferred range, and an approximate preferred value of the $Cl_2$ flow rate in standard cubic centimeters per minute (herein "sccm"), the HCl flow rate (in sccm and in the ratio of $Cl_2$:HCl flows), the $CHF_3$ flow rate (in sccm and in the ratio of $Cl_2$:$CHF_3$ flows), top electrode power (in watts), bottom electrode power (in watts), chamber pressures (in milliTorr), and bottom electrode temperature (in ° C.) are shown. Other parameter values that may be helpful for the etch will be readily apparent to those skilled in the art, whether for the same wafer and aluminum-containing layer or other wafers and aluminum-containing layers. Further, approximate scaling of the parameters may be performed, as can be appreciated by those skilled in the art, to accommodate other wafer sizes and/or chamber volumes.

TABLE 2

|  | Preferred Range | More Preferred Range | Preferred Value |
|---|---|---|---|
| $Cl_2$ flow rate (sccm) | 100–150 | 100–110 | 100 |
| HCl flow rate (sccm) | 10–30 | 10–20 | 12 |
| (Approx. Ratio of $Cl_2$:HCl Flow) | 15:1–3:1 | 11:1–5:1 | 8:1 |
| $CHF_3$ flow rate (sccm) | 5–20 | 5–15 | 7 |
| (Approx. Ratio of $Cl_2$:$CHF_3$ Flow) | 30:1–5:1 | 12:1–6.5:1 | 14:1 |
| Top Power Watts | 400–650 | 400–600 | 600 |
| Bottom Power (Watts) | 150–280 | 150–250 | 250 |
| Pressure (milliTorr) | 2–80 | 2–30 | 20 |
| Temperature (°C.) | 40–80 | 40–70 | 50 |

Table 3 illustrates the approximate results obtained when the inventive $Cl_2/HCl/CHF_3$ source gas compositions are employed for etching, in one example, through a 6-inch wafer having disposed thereon a 1000-angstrom thick TiN ARC layer, a 6000-angstrom thick aluminum alloy layer, and an underlying 600-angstrom thick TiN barrier layer. In Table 3, there are shown the approximate etch rate loading values for 0.35-micron geometry wafer (at the wafer's center and the wafer's edge), the TIN:PR (TiN:photoresist) selectivity, the selectivity value to PR (photoresist) obtained in the composite etch (through more than one layer, e.g., the TiN ARC layer and the aluminum-containing layer), the TiN etch rate (in angstroms/minute), the TiN etch uniformity value (measured using the 3-sigma method, which may be defined as three times the standard deviation of all points measured on the wafer), and the TiN:Oxide selectivity. Bear in mind that the following results are shown for illustration purposes only. The actual values obtained for a given etch using the inventive $Cl_2/HCl/CHF_3$ source gas compositions may vary depending on many factors, including the total flow rate, the type of plasma reactor employed, and the deposition conditions as well as the make-up of the etched layers.

TABLE 3

| Etch Rate Loading (0.35 micron) | |
| --- | --- |
| At wafer's center | 3.16 |
| At wafer's edge | 4.16 |
| TiN to PR (Photoresist) selectivity | 2.9:1 |
| Composite to PR (Photoresist) selectivity | 6.5:1 |
| TiN Etch Rate (Angstroms/minute) | 9,800 |
| Uniformity for TiN etch | 3.87% |
| TiN:Oxide Selectivity | 5.5:1 |

As shown in Table 3, the inventive use of the $Cl_2/HCl/CHF_3$ source gas advantageously results in an etch rate loading value (for a 0.35 micron geometry) of less than about 5%. Specifically, the etch rate loading value is about 3.6% at the wafer's center (for a 0.35 micron geometry). In contrast, an analogous etch rate loading value for the prior art $Cl_2/BCl_3$ etch, in some cases, is about 18%. Further, the etch rate loading value at the wafer's edge (for a 0.35 micron geometry) is about 4.16% at the wafer's edge. In contrast, an analogous etch rate loading value for the prior art $Cl_2/BCl_3$ etch, in some cases, is about 28%.

The TIN:PR selectivity (the photoresist may be, e.g., I-line photoresist) is about 2:9 to 1. In contrast, the TN:photoresist selectivity for the prior art $Cl_2/BCl_3$ etch, in some cases, is less than about 1:1. The composite:photoresist selectivity (i.e., the selectivity of the multiple layers to the photoresist) is about 6.5 to 1, as shown in Table 3. In contrast, the composite:PR selectivity for the prior art $Cl_2/BCl_3$ etch is, in some cases, less than about 3:1.

As shown in Table 3, the use of the inventive $Cl_2/HCl/CHF_3$ source gas yields an advantageously high TiN etch rate of about 9,800 angstroms per minute. In contrast, the TiN etch rate for the prior art $Cl_2/BCl_3$ etch is, in some cases, only about 2,500 angstroms per minute.

Uniformity for the TiN etch is advantageously good, at a low value of about 3.87%. Further, the TiN:Oxide selectivity is advantageously high in this invention, about 5.5:1. In contrast, the TiN:Oxide selectivity in the prior art $Cl_2/BCl_3$ etch is, in some cases, about 2.5:1. In some cases, it is expected that the aluminum etch rate may be about 8,000 angstrom/minute.

Figure 4:
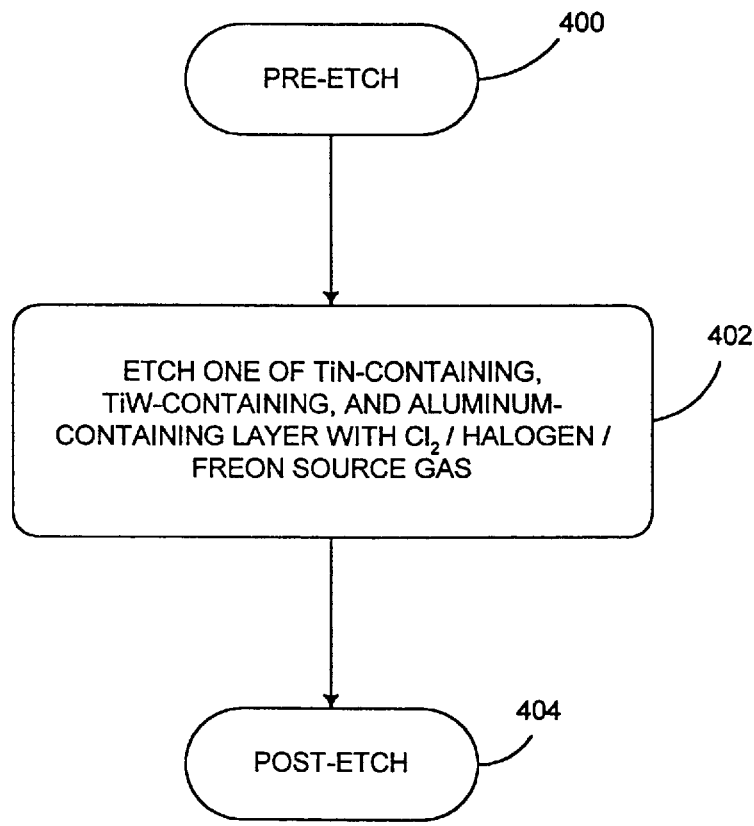
FIG. 4 shows, in accordance with one embodiment of the present invention, the inventive etching technique wherein the inventive source gas is employed to etch at least one of the TiN layer, the aluminum-containing layer, and the TiW layer of a layer stack.

FIG. 4 shows, in accordance with one embodiment of the present invention, the inventive etching technique wherein the inventive $Cl_2/HCl/CHF_3$ source gas is employed to etch partially through at least one of the TiN ARC layer, the aluminum-containing metallization layer, or the underlying TiN barrier layer. It should be understood that prior to employing the inventive etch technique disclosed herein, the wafer may have to be prepared for etching in a conventional pre-etch step 400. The pre-etch step may include, for example, clamping the wafer onto chuck, stabilizing the pressure within the plasma processing chamber, and introducing helium cooling gas to the wafer backside to facilitate heat transfer between the wafer and the chuck.

In step 402, at least one of the TiN layer, the TiW layer, and/or the aluminum-containing layer is at least partially etched using the inventive source gas. In one embodiment, these layers are etched using the gas flow ratios of Tables 1 and 2 and/or other parameters shown therein, appropriately scaled for the wafer size and chamber volume. In step 404, the wafer may undergo additional post-etch processing steps that are conventional in nature. Thereafter, the finished wafer may be cut into dies, which may then be made into IC chips. The resulting IC chip, e.g., IC chips 352 of FIG. 3, may then be incorporated in an electronic device, e.g., any of the of well known commercial or consumer electronic devices, including digital computers.

Figure 5:
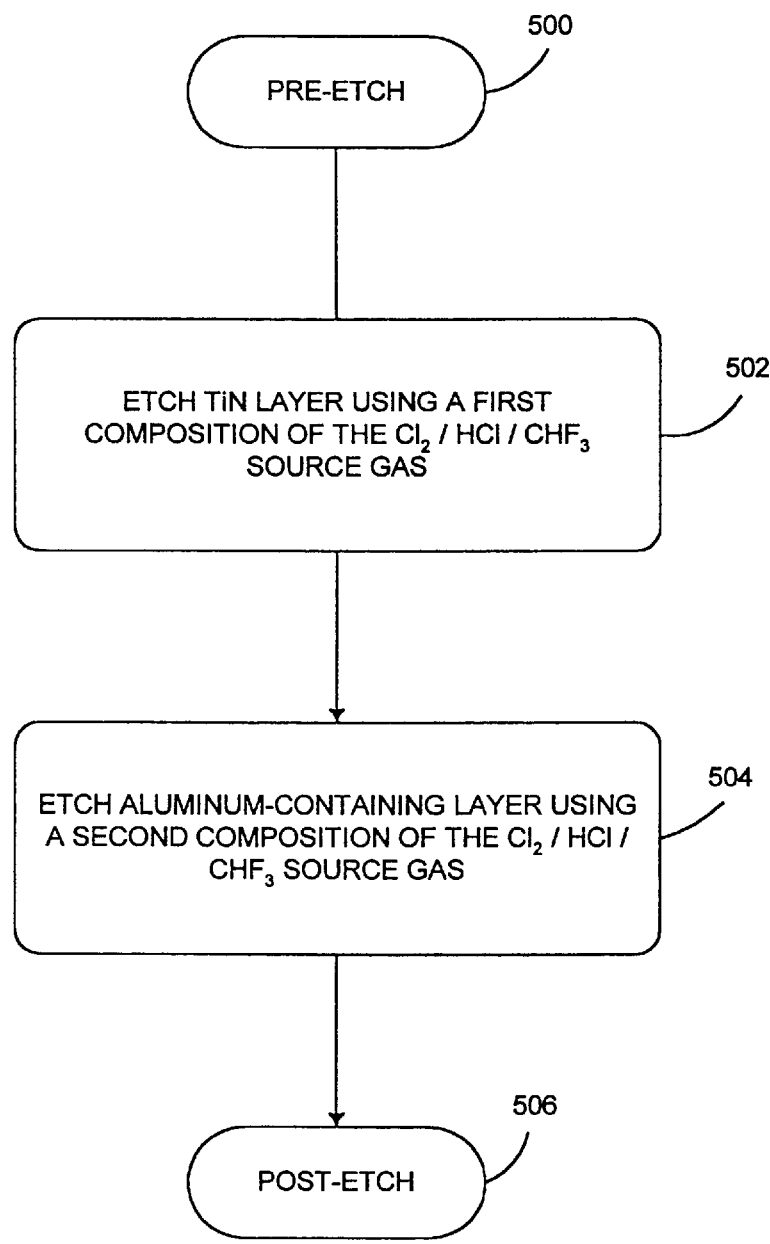
FIG. 5 shows, in accordance with one embodiment of the present invention, the inventive etching technique wherein different compositions of the inventive source gas is employed to etch different layers of the layer stack.

FIG. 5 shows, in accordance with another embodiment of the present invention, the inventive etching technique wherein different $Cl_2/HCl/CHF_3$ source gas compositions are employed to etch through different layers of the wafer stack. In step 500, the wafer undergoes a conventional pre-etch step analogous to the pre-etch step discussed in connection with step 400 of FIG. 4. In step 502, a portion of the TiN or TiW layer is at least partially etched using a first source gas composition of the inventive $Cl_2/HCl/CHF_3$ source gas. In step 504, a portion of the aluminum-containing layer, e.g., the aluminum metallization layer, is at least partially etched with a second source gas composition of the inventive $Cl_2/HCl/CHF_3$ source gas.

In one embodiment, the second source gas composition has a higher $Cl_2$ flow compared to inhibitor flow than the first source gas composition. Further, the second source gas composition may have, in one embodiment, a higher $Cl_2$:HCl component gases flow ratio than that of the first source gas composition. Additionally, the second source gas composition may have, in one embodiment, a higher $Cl_2$:$CHF_3$ component gases flow ratio than that of the first source gas composition. The increased $CHF_3$ in the first source gas composition helps to improve the TiN etch rate. On the other hand, a lower $CHF_3$ flow in the second source gas composition helps prevents the possibility of reverse microloading, i.e., the faster etching in narrower spacings compared to open field regions due to a high degree of polymer micromasking.

In step 506, which is analogous to step 404 of FIG. 5, the wafer may undergo additional post-etch processing steps that are conventional in nature. Thereafter, the finished wafer may be cut into dies, which may then be made into IC chips. The resulting IC chip, e.g., IC chips 352 of FIG. 3, may then be incorporated in an electronic device, e.g., any of the of well known commercial or consumer electronic devices, including digital computers.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. In a plasma processing chamber, a method for etching through an aluminum-containing layer and a titanium-containing layer, said aluminum-containing layer and said titanium-containing layer being disposed above a wafer, comprising:

a first etching step, said first etching step etches at least partially through said titanium-containing layer using a first source gas composition, said first source gas composition comprising a $Cl_2$ etchant and a first mixture, said first mixture comprising one of HCl and HBr, and freon comprising one of $CHF_3$ and $C_2HF_5$, said first source gas composition having a first flow ratio of said $Cl_2$ etchant to said first mixture; and a second etching step, said second etching step etches at least partially through said aluminum-containing layer using a second source gas composition, said second source gas composition comprising said $Cl_2$ etchant and a second mixture, said second mixture comprising one of said HCl and said HBr, and said freon comprising one of $CHF_3$ and $C_2HF_5$, said second source gas composition having a second flow ratio of said $Cl_2$ etchant to said second mixture different from said first flow ratio.

2. The method of claim 1 wherein said titanium-containing layer is a TiN layer.

3. The method of claim 2 wherein said first flow ratio is smaller than said second flow ratio.

4. The method of claim 3 wherein said plasma processing chamber represents a transformer-coupled plasma processing chamber.

5. The method of claim 2 wherein said wafer is disposed on a chuck during said first and second etching steps, said chuck being maintained at about 40°–70° C. during at least a portion of one of said first and second etching steps.

6. The method of claim 2 wherein a flow ratio of said $Cl_2$ etchant to said HCl is about 3:1 during said first etching step.

7. The method of claim 1 wherein said first and second source gas compositions are $Cl_2$/HCl/$CHF_3$.

8. The method of claim 7 wherein a flow ratio of said $Cl_2$ etchant to said $CHF_3$ is about 7:1 during said first etching step.

9. The method of claim 7 wherein a flow ratio of said $Cl_2$ etchant to said HCl is about 8:1 during said second etching step.

10. The method of claim 9 wherein a flow ratio of said $Cl_2$ etchant to said $CHF_3$ is about 14:1 during said second etching step.

11. The method of claim 1 wherein said titanium-containing layer is a TiW layer.

12. The method of claim 11 wherein said first and second source gas compositions are $Cl_2$/HCl/$CHF_3$.

13. The method of claim 11 wherein said first and second source gas compositions are $Cl_2$/HCl/$CHF_3$, said titanium-containing layer represents a TiN anti-reflective layer, said aluminum-containing layer represents a metallization layer that underlies said titanium-containing layer.

14. In a plasma processing chamber, a method for etching through an aluminum-containing layer and TiN layer, said TiN layer being disposed above said aluminum-containing layer, comprising:

a first etching step, said first etching step etches at least partially through said TiN layer using a first source gas composition, said first source gas composition comprising a $Cl_2$ etchant and a first mixture, said first mixture comprising HCl and $CHF_3$, said first source gas composition having a first flow ratio of said $Cl_2$ etchant to said first mixture.

15. The method of claim 14 wherein a flow ratio of said $Cl_2$ etchant to said HCl is about 6:1 to about 1.5:1 during said first etching step.

16. The method of claim 15 wherein a flow ratio of said $Cl_2$ etchant to said HCl is about 3:1 during said first etching step.

17. The method of claim 15 wherein a flow ratio of said $Cl_2$ etchant to said $CHF_3$ is about 12:1 to about 2:1 during said first etching step.

18. The method of claim 15 wherein a flow ratio of said $Cl_2$ etchant to said $CHF_3$ is about 7:1 during said first etching step.

19. The method of claim 14 further comprising a second etching step, said second etching step etches at least partially through said aluminum-containing layer using a second source gas composition, said second source gas composition comprising said $Cl_2$ etchant and a second mixture, said second mixture comprising HCl and $CHF_3$, said second source gas composition having a second flow ratio of said $Cl_2$ etchant to said first mixture different from said first flow ratio.

20. The method of claim 19 wherein a flow ratio of said $Cl_2$ etchant to said HCl is about 8:1 during said second etching step.

21. The method of claim 19 wherein a flow ratio of said $Cl_2$ etchant to said $CHF_3$ is about 14:1 during said second etching step.

22. In a plasma processing chamber, a method for etching through a selected portion of an aluminum-containing layer and a titanium-containing layer, said titanium-containing layer being disposed above said aluminum-containing layer, said aluminum-containing layer being disposed on a wafer, comprising:

a first etching step, said first etching step etches at least partially through said titanium-containing layer using a first source gas composition, said first source gas composition consisting essentially of said $Cl_2$ etchant and a first mixture, said first mixture consisting essentially of HCl and $CHF_3$, said first source gas composition having a first flow ratio of said $Cl_2$ etchant to said first mixture; and a second etching step, said second etching step etches at least partially through said aluminum-containing layer using a second source gas composition, said second source gas composition consisting essentially of a $Cl_2$ etchant and a second mixture, said second mixture consisting essentially of HCl and $CHF_3$, said second source gas composition having a second flow ratio of said $Cl_2$ etchant to said second mixture different from said first flow ratio.

23. The method of claim 22 wherein a flow ratio of said $Cl_2$ etchant to said HCl is about 3:1 during said first etching step.

24. The method of claim 23 wherein a flow ratio of said $Cl_2$ etchant to said HCl is about 8:1 during said second etching step.

25. The method of claim 22 wherein a flow ratio of said $Cl_2$ etchant to said $CHF_3$ is about 7:1 during said first etching step.

26. The method of claim 25 wherein a flow ratio of said $Cl_2$ etchant to said $CHF_3$ is about 14:1 during said second etching step.

* * * * *